US008641107B2

(12) United States Patent
Wu et al.

(10) Patent No.: US 8,641,107 B2
(45) Date of Patent: Feb. 4, 2014

(54) LATCH APPARATUS (75) Inventors: Morgan Y L Wu, Taipei (TW); Ian Lin, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 978 days.

(21) Appl. No.: 12/567,112

(22) Filed: Sep. 25, 2009

(65) Prior Publication Data
US 2010/0078948 A1    Apr. 1, 2010

(30) Foreign Application Priority Data

Sep. 30, 2008   (TW) .............................. 97137857 A (51) Int. Cl.
    *E05B 3/00*    (2006.01)
(52) U.S. Cl.
    USPC ...................................... 292/336.3
(58) Field of Classification Search
    CPC ....... E05B 83/26; E05B 85/16; E05B 65/006;
        E05B 73/0005; G06F 1/1616; A47B 88/047
    USPC ......... 292/1, 8, 10, 31, 32, 42, 114, 137, 162,
        292/175, 145, 146, 336, 336.3, 80, 81, 84,
        292/85, 87, 98, 194, 195, 198, 202, 219,
        292/220, 228, 303, 304, 95, 99, 101, 121,
        292/122, 128; 361/679.57, 679.58;
        312/333, 334.6, 334.7, 334.8, 334.13,
        312/334.23, 334.44, 334.46
    See application file for complete search history.

(56) References Cited

U.S. PATENT DOCUMENTS

| | | | | |
|---|---|---|---|---|
| 4,573,731 A | * | 3/1986 | Knaack et al. ............... 296/37.6 |
| 5,153,817 A | * | 10/1992 | Hosoi et al. ............... 361/679.37 |
| 5,262,923 A | * | 11/1993 | Batta et al. ............... 361/679.37 |
| 5,332,306 A | * | 7/1994 | Babb et al. ............... 312/334.16 |
| 5,510,955 A | * | 4/1996 | Taesang .................... 361/679.31 |
| 5,654,873 A | * | 8/1997 | Smithson et al. ........ 361/679.37 |
| 5,816,672 A | * | 10/1998 | LaPointe et al. ........... 312/223.2 |
| 6,185,092 B1 | | 2/2001 | Landrum et al. |
| 6,666,484 B1 | * | 12/2003 | Branch et al. ................. 292/128 |

(Continued)

FOREIGN PATENT DOCUMENTS

| | | |
|---|---|---|
| CN | 2521975 | 11/2002 |
| CN | 1631295 | 6/2005 |
| EP | 1515597 | 3/2005 |

(Continued)

*Primary Examiner* — Kristina R Fulton
*Assistant Examiner* — Nathan Cumar
(74) *Attorney, Agent, or Firm* — The Steadman Law Firm PLLC; Cynthia G. Seal; Katherine S. Brown (57) ABSTRACT A latch apparatus is disclosed comprising a latch supporting member and a latch member pivotally connected to the latch supporting member. The latch member comprises an extendable handle arm member. The latch apparatus further comprises a tray member connected to the latch supporting member and a cage member connected to the tray member. According to an exemplary embodiment, the latch member further comprises an engagement arm member comprising a first engaging member. Alternatively, the latch member further comprises a resilient member comprising a first engaging member. Moreover, the extendable handle arm member comprises a second engaging member. Furthermore, the latch supporting member comprises a third engaging member and a fourth engaging member. When the extendable handle arm member is in a latched position, the first engaging member is engaged with the cage member and the third engaging member, and the second engaging member is engaged with the fourth engaging member.

22 Claims, 6 Drawing Sheets

(56) References Cited

U.S. PATENT DOCUMENTS

| | | | |
|---|---|---|---|
| 6,891,723 B1 | 5/2005 | Lin et al. | |
| 6,935,521 B2 * | 8/2005 | Gundlach et al. | 211/183 |
| 6,956,735 B2 | 10/2005 | Lee et al. | |
| 6,962,397 B2 | 11/2005 | Dobler et al. | |
| 7,204,712 B2 * | 4/2007 | Schwiebert et al. | 439/352 |
| 7,256,989 B2 * | 8/2007 | Liu et al. | 361/679.33 |
| 2007/0195496 A1 * | 8/2007 | Wu et al. | 361/683 |

FOREIGN PATENT DOCUMENTS

| | | |
|---|---|---|
| JP | 2004355205 | 12/2004 |
| TW | 417942 | 1/2001 |
| TW | 441809 | 6/2001 |
| TW | 200733851 | 9/2007 |

* cited by examiner

LATCH APPARATUS

RELATED APPLICATION

This application claims priority under 35 U.S.C. §119 to Taiwanese Patent Application No. 97137857 filed Sep. 30, 2008, the entire text of which is specifically incorporated by reference herein.

BACKGROUND OF THE INVENTION

1. Field of the Invention

The various embodiments described herein relate generally to a latch apparatus and more particularly to a latch apparatus for a hot swappable device.

2. Description of the Related Art

A hot swappable device is a device that is removable during operation in a computer or peripheral systems environment. Hot swappable devices are important in a server level system or above. Using hot swappable devices, system capability can be expanded without interrupting the operation of the system.

The hot swappable devices used in a server may be a hot swappable power device, a hot swappable hard disk, a hot swappable optical disk drive (ODD), a hot swappable battery, a hot swappable fan, or a combination thereof. Hot swappable devices usually are mounted on a front end or a back end of the server so that they can be hot swappable from the front end or the back end. Also, handles and latches usually are mounted on the hot swappable devices.

Fan devices are widely used in current electronic devices. Fans are especially important for a high level server, as the heat dissipation criteria are much higher. Accordingly, a plurality of fans are used in a high level server to address the generated heat. These fans are usually hot swappable. Thus, if one or more of the fans do not work, the user need not shut down the system but rather can directly replace the affected fans without interrupting system operation.

In the trend of smaller electronic device sizes, there are different ways of arranging hot swappable devices. For example, a single hot swappable device may be installed in the inner space of an electronic device. Alternatively, a first hot swappable device may be installed in the inner space of the electronic device, and a second hot swappable device may be mounted in front of the first hot swappable device. For example, after a hot swappable hard disk is installed in a server through a slot on the front end, a hot swappable fan may be installed between the hot swappable hard disk and the slot entrance.

Regarding the above arrangement involving two hot swappable devices, since the hot swappable devices are installed in an inner space of the electronic device, and since one hot swappable device is installed in front of another, conventional removal of the hot swappable devices is rather difficult. In accordance with the above arrangement, a second hot swappable device may be installed in front of a first hot swappable device inside a smaller server (such as a 1-U server or a 2-U server), and thus conventionally a user must insert one or more fingers into the inner space of the server to remove the hot swappable devices, thus exposing himself to potential injury. Thus, a latch apparatus that allows easy removal of the hot swappable devices is desired.

SUMMARY OF THE INVENTION

The various embodiments described herein provide a latch apparatus. The latch apparatus is capable of latching one or more devices (e.g., hot swappable devices) to a cage member. According to an exemplary embodiment, in a scenario in which a first hot swappable device is mounted in an inner space of a server and a second hot swappable device is mounted in front of the first hot swappable device, the first and second hot swappable devices can be unlatched and removed without using assembly tools and with reduced risk of finger injury. Therefore, the assembly process with respect to the hot swappable devices may be simplified, and the allocation of hot swappable devices inside the server may be improved. According to an exemplary embodiment, no additional assembly tools are required, thus reducing the necessity of fastening devices such as screws. As a result, the assembly process is fast and simple.

According to the various embodiments described herein, a user may unlatch a hot swappable device even if the device is located deep within an electronic device (e.g., a server). Thus, multiple hot swappable devices can be mounted inside the server, and the allocation of such devices is more flexible.

In accordance with a first aspect of the various embodiments described herein, a latch apparatus is provided. The latch apparatus may comprise a latch supporting member and a latch member pivotally connected to the latch supporting member. The latch member may comprise an extendable handle arm member, and the latch supporting member may comprise a tube member. The latch apparatus further may comprise a tray member connected to the latch supporting member and a cage member connected to the tray member.

Moreover, a first device may be mounted on the tray member. The first device may be located inside the cage member, and a second device may be mounted in front of the first device. Each of the first and second devices may be selected from a group comprising a hot swappable power device, a hot swappable hard disk, a hot swappable optical disk drive (ODD), a hot swappable battery, and a hot swappable fan.

Furthermore, the tray member of the latch apparatus may comprise a tray body member and a supporting member, and the latch supporting member and the supporting member may be respectively mounted on two corners of the tray body member. The supporting member may comprise a tube member. The tray body member, the latch supporting member, and the supporting member may define a space for mounting the second device. The tray body member, the latch supporting member, and the supporting member may be integrally formed. Alternatively, the tray body member, the latch supporting member, and the supporting member may be respectively connected by a fastening member.

In accordance with an exemplary embodiment, the latch member of the latch apparatus further may comprise an engagement arm member. The engagement arm member may comprise a first engaging member. Moreover, the extendable handle arm member of the latch member may comprise a second engaging member. Furthermore, the latch supporting member may comprise a third engaging member and a fourth engaging member. When the extendable handle arm member is in a first position, the first engaging member is engaged with the cage member and the third engaging member, and the second engaging member is engaged with the fourth engaging member. When the extendable handle arm member is in a second position, the first engaging member is disengaged from the cage member and the third engaging member, and the second engaging member is disengaged from the fourth engaging member. The first position may be a latched position, and the second position may be an unlatched position.

Moreover, the latch member further may comprise a linkage member connected to the extendable handle arm member and the engagement arm member, wherein the linkage member actuates the first engaging member to disengage from the cage member and the third engaging member.

Furthermore, the first engaging member may comprise a first hook protruding outward from the engagement arm member. The second engaging member may comprise a second engagement hole formed on the extendable handle arm member. The cage member may comprise a device housing, and the device housing may comprise a first aperture formed on an inner surface thereof for engagement with the first hook. The first hook may comprise a guiding edge and an engaging edge. The third engaging member may comprise a pair of engagement holes for engagement with the first hook, and the fourth engaging member may comprise a second hook for engagement with the second engagement hole.

In accordance with another exemplary embodiment, the latch member of the latch apparatus further may comprise a resilient member. The resilient member may comprise a first engaging member. Moreover, the extendable handle arm member of the latch member may comprise a second engaging member. Furthermore, the latch supporting member may comprise a third engaging member and a fourth engaging member. When the extendable handle arm is in a first position, the first engaging member is engaged with the cage member and the third engaging member, and the second engaging member is engaged with the fourth engaging member. When the extendable handle arm is in a second position, the first engaging member is disengaged from the cage member and the third engaging member, and the second engaging member is disengaged from the fourth engaging member. The first position may be a latched position, and the second position may be an unlatched position.

Additionally, the first engaging member may comprise a first hook protruding outward from the resilient member. The second engaging member may comprise a second engagement hole formed on the extendable handle arm member. The cage member may comprise a device housing, and the device housing may comprise a first aperture formed on an inner surface thereof for engagement with the first hook. The first hook may comprise a guiding edge and an engaging edge. The third engaging member may comprise a pair of engagement holes for engagement with the first hook, and the fourth engaging member may comprise a second hook for engagement with the second engagement hole.

BRIEF DESCRIPTION OF THE DRAWINGS

The various embodiments described herein are particularly pointed out and distinctly claimed in the claims herein. The foregoing and other objects, features, and advantages of the various embodiments are apparent from the following detailed description taken in conjunction with the accompanying drawings, in which:

The detailed description explains the various embodiments, together with advantages and features, by way of example with reference to the drawings.

DETAILED DESCRIPTION

The various embodiments now will be described with reference to the accompanying drawings, in which illustrative exemplary embodiments are shown. However, the various embodiments may assume many different forms and should not be construed as limited to the exemplary embodiments set forth herein. Rather, the exemplary embodiments are provided so that this disclosure is thorough and complete and fully conveys the scope of the various embodiments to those skilled in the art. Like numbers refer to like elements throughout.

Figure 1:
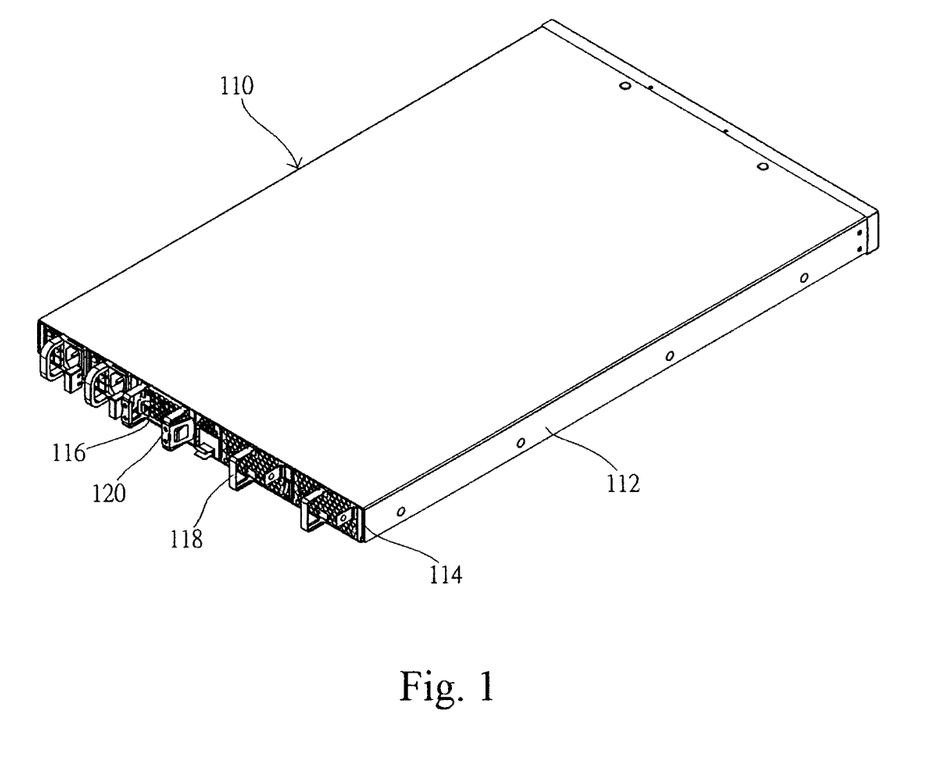
FIG. 1 illustrates a server according to an exemplary embodiment.

FIG. 1 illustrates an exemplary embodiment of a server 110 on which various devices can be mounted. The server 110 comprises a server chassis 112. The server chassis 112 is a box-like chassis and has a rear end opening 114. The rear end opening 114 has a plurality of slots 116, in which various devices can be mounted. The various devices can comprise a hard disk fan 120, a hard disk (not shown), and a fan 118 for heat dissipation of the server 110.

Figure 2A:
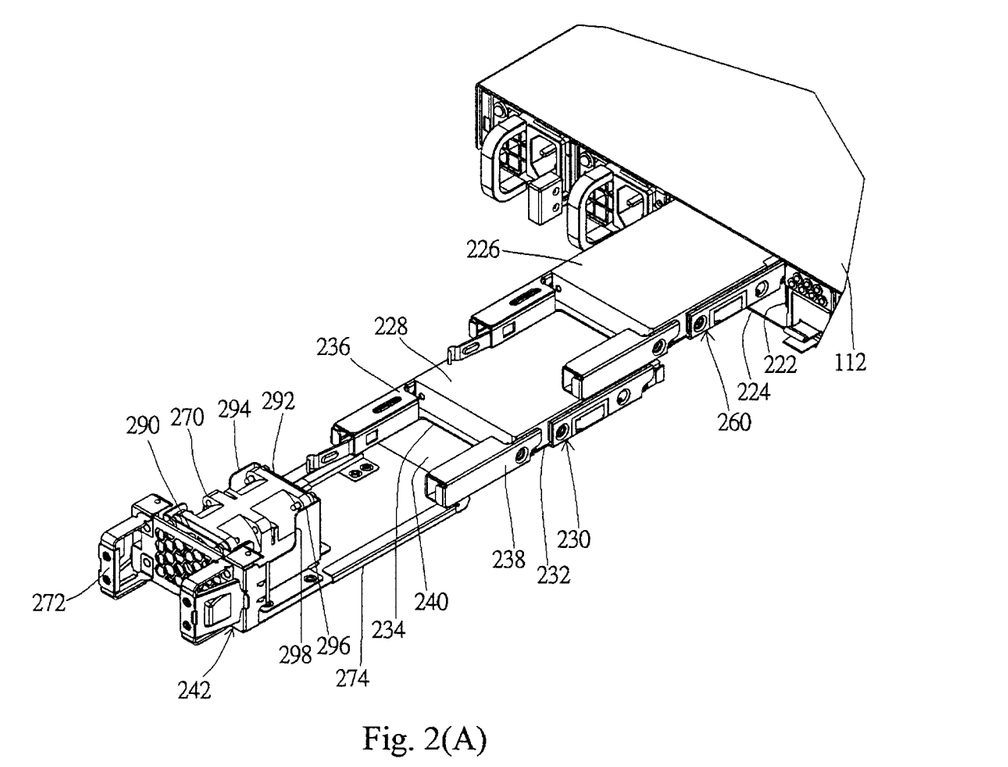
FIGS. 2(A) and 2(B) illustrate a latch apparatus of a server according to an exemplary embodiment.
Figure 2B:
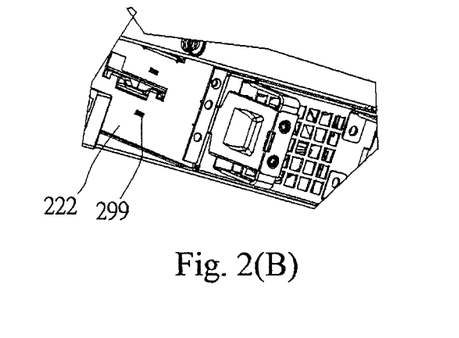

FIGS. 2(A) and 2(B) illustrate an exemplary embodiment of a latch apparatus of a server 110. Each slot 116 in the server chassis 112 of the server 110 contains a device chassis 222. The device chassis 222 is a box-like chassis of sheet material having an upper wall, a lower wall, and side walls. These walls define a front end opening 224. The device chassis 222 can be used to contain a device (e.g., a hot swappable fan 118 as illustrated in FIG. 1) or multiple devices (e.g., two hot swappable hard disks 226 and 228 and a hot swappable fan 242 as illustrated in FIG. 2(A)). Sockets are mounted on the back end of the device chassis 222 for connection purposes. As illustrated in FIG. 2(B), an aperture 299 is formed on a side wall of the device chassis 222 (e.g., the left side wall or the right side wall of the device chassis 222).

As illustrated in FIG. 2(A), the device chassis 222 may be designed to contain two hot swappable hard disks 226 and 228. The hot swappable hard disks 226 and 228 may be supported by trays 260 and 230 respectively. For example, the tray 230 has a rectangular tray body 232 of sheet material for supporting the hot swappable hard disk 228. The sheet material may comprise metal or plastic. The tray body has a front end 234, a back end, and a plurality of heat dissipation holes. A latch supporting member 236 and a supporting member 238 are respectively mounted on two corners of the front end 234 of the tray 230. The latch supporting member 236 and the supporting member 238 each may be a tube of rectangular shape. The latch supporting member 236 and the supporting member 238 may be fastened on the tray body 232 by fastening devices (e.g., screws). Alternatively, the tray body 232, the latch supporting member 236, and the supporting member 238 may be integrally formed. The tray body 232, the latch supporting member 236, and the supporting member 238 can define a containing space, e.g., a cuboid space 240. In other words, all supporting members (in this exemplary embodiment, the latch supporting member 236 and the supporting member 238) and the tray body 232 define a space 240 for containing one or more devices. For example, the device to be contained may comprise a hot swappable fan 242 for heat dissipation purposes. As illustrated in FIG. 2(A), the hot swappable fan 242 may comprise an air inlet surface 292, an air outlet surface 290, and side surfaces between the air inlet surface 292 and the air outlet surface 290. The hot swappable fan 242 may be a conventional hot swappable fan comprising a tray part 274, a fan part 270 mounted on the tray part 274, and a handle part 272 connected to the tray part 274. In a conventional way, the handle part 272 may be connected to the tray part 274 by fastening devices (e.g., screws). Moreover, in a conventional way, the fan part 270 may be mounted on the brackets on the air inlet surface 292 and the brackets on the air outlet surface 290 by fastening devices (e.g., screws). The hot swappable fan 242 further may comprise a conventional terminal device. The terminal device may allow the hot swappable fan 242 to be electrically connected to the server so that the hot swappable fan 242 can operate to achieve the heat dissipation purpose.

Figure 3:
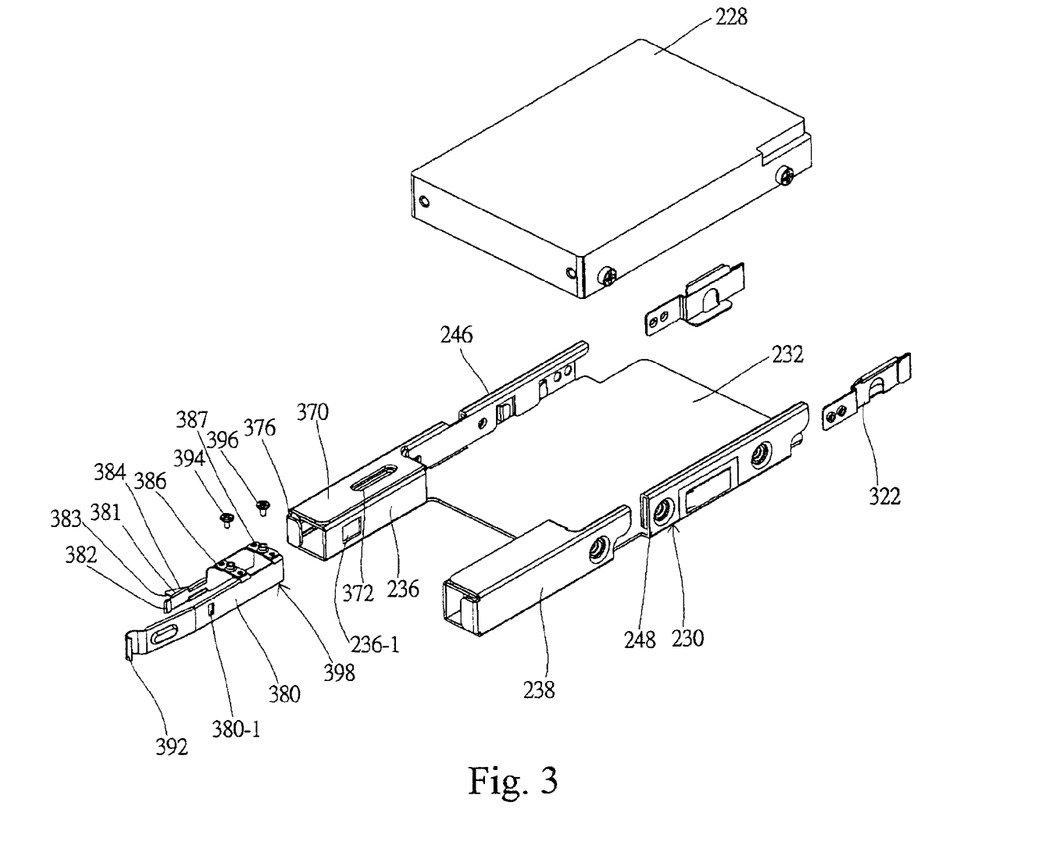
FIG. 3 shows an exploded view of the latch apparatus according to an exemplary embodiment.

FIG. 3 shows an exploded view of the latch apparatus according to an exemplary embodiment, wherein the tray 230, the hot swappable hard disk 228, the supporting member 238, the latch supporting member 236, and a latch member 398 are shown. As illustrated in FIGS. 2(A) and 3, the hot swappable hard disks 226 and 228 may be respectively fastened to the trays 260 and 230 in a conventional way by fastening devices (e.g., screws). Moreover, with respect to the tray 230, two upwardly protruding rails 246 and 248 are respectively mounted on two sides of the tray body 232. The tray body 232 and the two upwardly protruding rails 246 and 248 may be integrally formed. Alternatively, the tray body 232 and the two upwardly protruding rails 246 and 248 may be assembled by screws. By using conventional railing technology, the rails 246 and 248 can cooperate with trenches of the device chassis 222 such that the tray 230 and the hot swappable disk 228 fastened thereto can slide with respect to the device chassis 222. According to the above arrangement, the hot swappable hard disks 226 and 228 may be respectively mounted on the trays 260 and 230, and the hot swappable hard disks 226 and 228 may be hot swappable by using conventional hot swappable device technology.

As illustrated in FIG. 3, the tray 230 comprises the tray body 232 and a pair of hot swappable hard disk fastening devices 322 for fastening the hot swappable hard disk 228 to the tray 230. As previously described, the latch apparatus comprises the latch supporting member 236 and the latch member 398, the latch member 398 being partially contained in the latch supporting member 236. According to an exemplary embodiment, the latch member 398 comprises an extendable handle arm 380, an engagement arm 382, and a linkage member comprising a first linkage part 386 and a second linkage part 387. The extendable handle arm 380 and the engagement arm 382 each may be made of rigid material such as metal or plastic. The first linkage part 386 and the second linkage part 387 are connected to the extendable handle arm 380 and the engagement arm 382. The first linkage part 386 and the second linkage part 387 of the linkage member may be made of rigid and resilient material such as stainless steel or plastic.

The components of the latch member 398 may comprise a first engaging member and a third engaging member, and the latch supporting member 236 may comprise a second engaging member and a fourth engaging member. The engagement arm 382 may comprise the first engaging member, e.g., a first hook 381. The first hook 381 may comprise a guiding edge 384 and an engaging edge 383. The first engaging member can cooperatively work with the third engaging member, e.g., a pair of first engagement holes 498 of the latch supporting member 236 (see FIG. 4(B)). By using conventional fastening devices, such as screws 394 and 396, the latch member 398 may be pivotally mounted on the latch supporting member 236. According to the above arrangement, the latch member 398 may have a cross section of "U" shape. The first linkage part 386 and the second linkage part 387 of the linkage mem-
ber are located on the pivot point. A handle 392 (e.g., a handle hook) is mounted on one end of the extendable handle arm 380 so that a user can use a single finger to exert a force thereon. The extendable handle arm 380 comprises the second engaging member, e.g., a second engagement hole 380-1. The second engaging member can cooperatively work with the fourth engaging member, e.g., a second hook 236-1 of the latch supporting member 236.

Figure 4A:
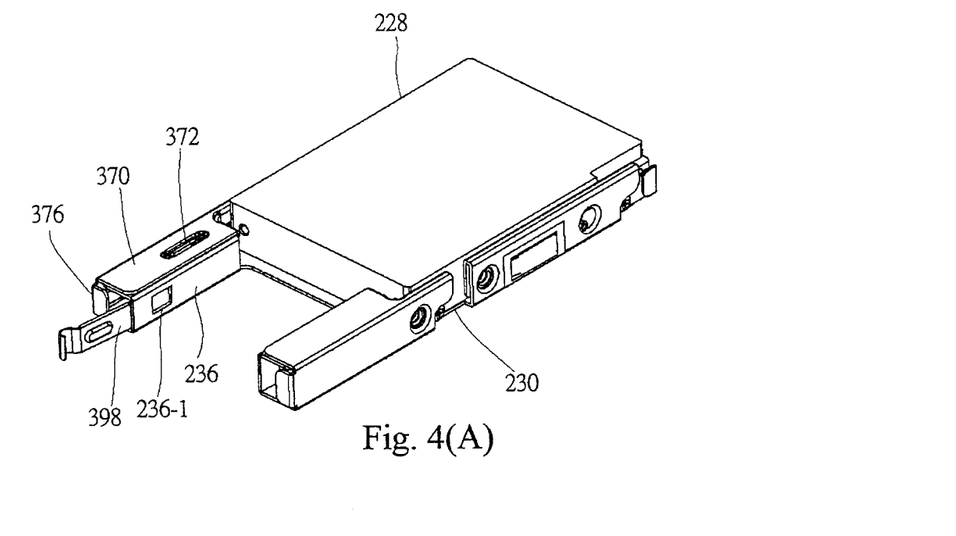
FIGS. 4(A), 4(B), and 4(C) schematically show the assembly of the components illustrated in FIG. 3 according to an exemplary embodiment.
Figure 4B:
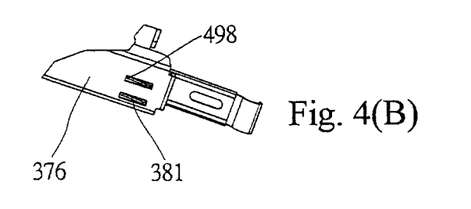
Figure 4C:
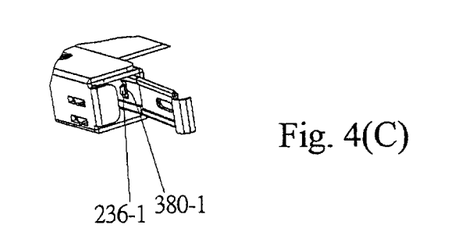

FIGS. 4(A), 4(B), and 4(C) schematically show the assembly of the tray 230, the hot swappable hard disk 228, the latch supporting member 236, the supporting member 238, and the latch member 398. As illustrated in FIG. 4(A), the latch supporting member 236 may be a rectangular tube. A connection hole 372 is formed on a side 370 of the latch supporting member 236. As illustrated in FIG. 4(B), the pair of first engagement holes 498 are formed on a side 376 adjacent to the side 370 to cooperatively work with the first hook 381 of the engagement arm 382. As illustrated in FIG. 4(C), the second hook 236-1 is formed on a side opposite to the side 376 to cooperatively work with the second engagement hole 380-1 of the extendable handle arm 380. FIG. 4(C) depicts how the second engagement hole 380-1 is engaged with the second hook 236-1. The supporting member 238 may be a rectangular tube similar to the latch supporting member 236, but without the connection hole and the engaging members thereon.

As illustrated in FIGS. 3 and 4(A), the latch member 398 is partially contained in the latch supporting member 236. By using conventional pivot connection technology, such as the use of the connection hole 372 and the screws 394 and 396, the latch member 398 may be pivotally connected to the latch supporting member 236.

Figure 5A:
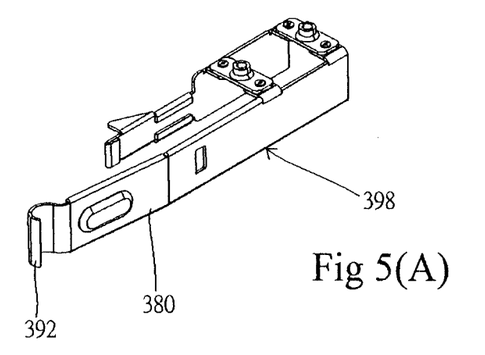
FIGS. 5(A) and 5(B) schematically show an extendable handle arm member of the latch apparatus in a latched position and an unlatched position respectively according to an exemplary embodiment.
Figure 5B:
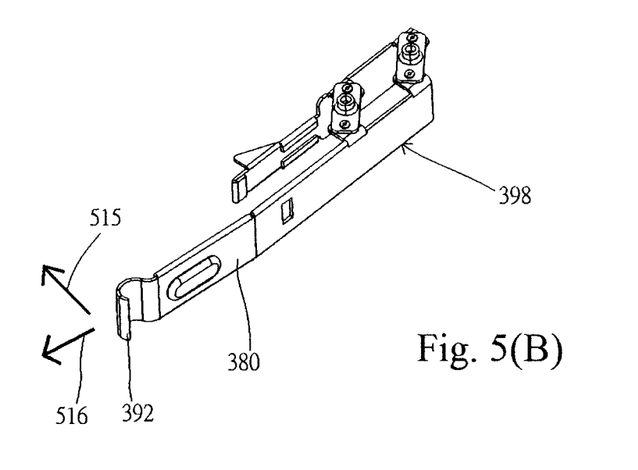

FIGS. 5(A) and 5(B) schematically show the extendable handle arm member 380 of the latch member 398 in a latched position and in an unlatched position respectively according to an exemplary embodiment. Once the latch member 398 is assembled in the latch supporting member 236, the extendable handle arm 380 is initially in the latched position. When the extendable handle arm 380 is in the latched position (see FIG. 5(A)), the engaging edge 383 of the first hook 381 of the engagement arm 382 is engaged with the first engagement holes 498 of the latch supporting member 236, and the second engagement hole 380-1 of the extendable handle arm 380 is engaged with the second hook 236-1 of the latch supporting member 236. Accordingly, the engagement arm 382 of the latch member 398 is firmly engaged with the latch supporting member 236.

The aperture 299 of the device chassis 222 illustrated in FIG. 2(B) is designed to be formed at a location corresponding to the first engagement holes 498 illustrated in FIG. 4(B). Accordingly, when the extendable handle arm 380 is in the latched position, the first hook 381 of the engagement arm 382 is engaged with the aperture 299 of the device chassis 222 as well as the first engagement holes 498. That is to say, when the assembly of the tray 230 is latched in the device chassis 222, the first hook 381 is engaged with the first engagement holes 498, and simultaneously the first hook 381 is engaged with the aperture 299.

When the extendable handle arm 380 is in the unlatched position (see FIG. 5(B)), the first hook 381 is disengaged from the aperture 299 of the device chassis 222 and the first engagement holes 498, and the second engagement hole 380-1 is disengaged from the second hook 236-1. To transition from the latched position to the unlatched position, a user exerts a force on the handle hook 392 of the extendable handle arm 380 and moves the handle hook 392 toward the direction indicated by an arrow 515 in FIG. 5(B). Consequently, the second engagement hole 380-1 of the extendable handle arm 380 is disengaged from the second hook 236-1 of the latch supporting member 236. Subsequently, the user moves the handle hook 392 toward a direction indicated by an arrow 516 in FIG. 5(B), and the extendable handle arm 380 thus is extended. Due to the operation of the first linkage part 386 and the second linkage part 387 of the linkage member, the engagement arm 382 is guided by the guiding edge 384 of the first hook 381 and moves toward a direction opposite to the direction of force exertion. Consequently, the first hook 381 is disengaged from the first engagement holes 498, and simultaneously the first hook 381 is disengaged from the aperture 299.

That is to say, if the user desires to unlatch the assembly of the tray 230 from the device chassis 222, the user need only exert a force on the handle hook 392 of the extendable handle arm 380 and move the handle hook 392 as indicated by the arrows 515 and 516 in FIG. 5(B). Taking a 1-U server for example, unlatching is simple despite small size. Specifically, the user uses a single finger (e.g., index finger) to move the handle hook 392 of the extendable handle arm 380 toward a direction indicated by the arrow 515. Consequently, the second engagement hole 380-1 is disengaged from the second hook 236-1. Subsequently, the user uses the finger to move the handle hook 392 toward a direction indicated by the arrow 516. Due to the action of the first linkage part 386 and the second linkage part 387 of the linkage member, the engagement arm 382 is guided by the guiding edge 384 of the first hook 381 and is moved toward a direction opposite to the direction of force exertion. Consequently, the first hook 381 is disengaged from the first engagement holes 498, and simultaneously the first hook 381 is disengaged from the aperture 299 of the device chassis 222. In sum, the user may use a single finger to successfully unlatch the tray 230 and the first hot swappable device fastened thereto (i.e., the hot swappable hard disk 228) from the device chassis 222 while reducing the risk of finger injury.

Figure 6:
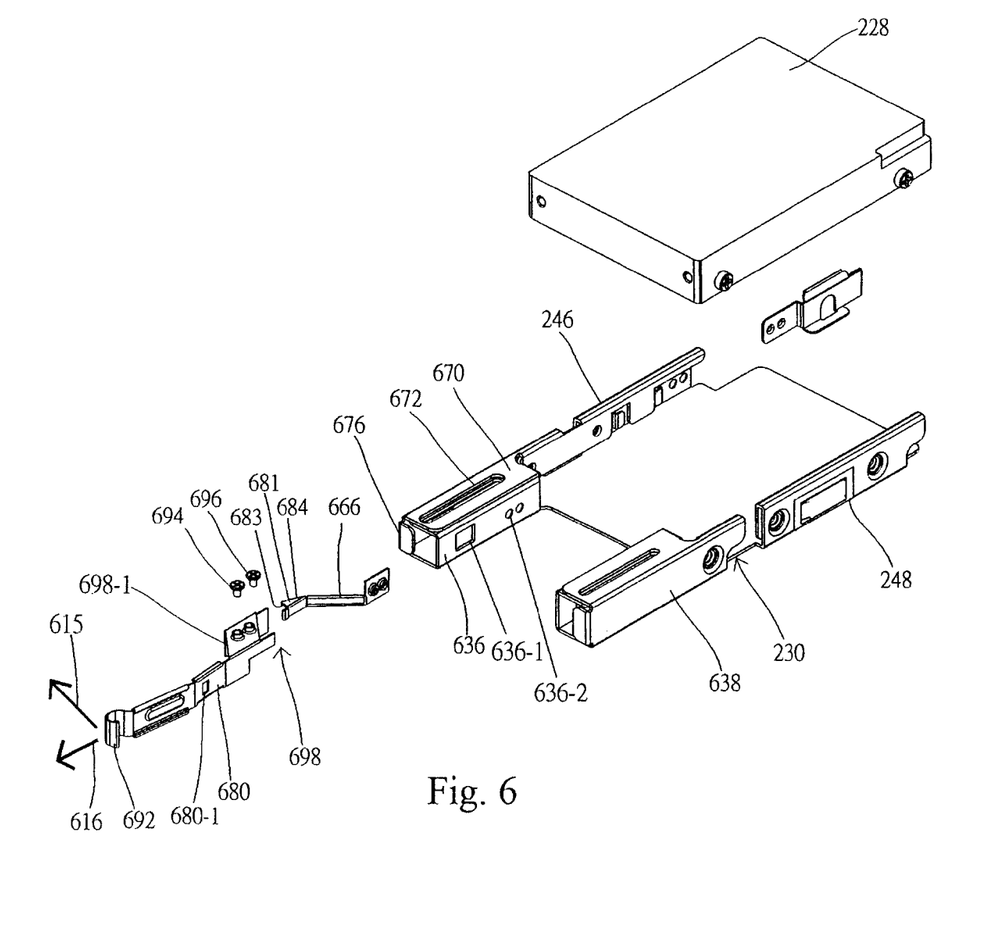
FIG. 6 shows an exploded view of the latch apparatus according to another exemplary embodiment.

FIG. 6 shows an exploded view of the latch apparatus according to another exemplary embodiment, wherein the tray 230, the hot swappable hard disk 228, a supporting member 638, a latch supporting member 636, and a latch member 698 are shown. The hot swappable hard disk 228 may be fastened to the tray 230 by fastening devices in a conventional way (e.g., screws). Two upwardly protruding rails 246 and 248 are respectively mounted on two sides of the tray body 232. By using conventional railing technology, the rails 246 and 248 may cooperate with trenches of the device chassis 222 such that the tray 230 and the hot swappable hard disk 228 fastened thereto can slide with respect to the device chassis 222. According to the above arrangement, the hot swappable hard disk 228 may be mounted on the tray 230, and the hot swappable hard disk 228 may be hot swappable by using conventional hot swappable device technology. As previously mentioned and as illustrated in FIG. 2(B), an aperture 299 is formed on the side wall of the device chassis 222 (e.g., the left side wall or the right side wall of the device chassis 222).

The latch member 698 comprises an extendable handle arm 680 and a resilient member 666. The extendable handle arm 680 and the resilient member 666 may be made of rigid material such as stainless steel or plastic. The components of the latch member 698 may comprise a first engaging member and a third engaging member, and the latch supporting member 636 may comprise a second engaging member and a fourth engaging member. The resilient member 666 may comprise the first engaging member, e.g., a first hook 681 mounted on one end of the resilient member 666. The first hook 681 may comprise a guiding edge 684 and an engaging edge 683. The first engaging member may cooperatively work with the third engaging member, e.g., a pair of first engagement holes (not shown) formed on the latch supporting member 636. A handle hook 692 is mounted on one end of the extendable handle arm 680 so that a user can exert a force thereon via a finger or other means. The extendable handle arm 680 comprises the second engaging member, e.g., a second engagement hole 680-1. The second engaging member may cooperatively work with the fourth engaging member, e.g., a second hook 636-1 of the latch supporting member 636.

The latch supporting member 636 may be a rectangular tube. A connection hole 672 is formed on a side 670 of the latch supporting member 636. The pair of first engagement holes are formed on a side 676 adjacent to the side 670 to cooperatively work with the first hook 681 of the resilient member 666. The second hook 636-1 is mounted on a side opposite to the side 676 to cooperatively work with the second engagement hole 680-1 of the extendable handle arm 680. The supporting member 638 may be a rectangular tube similar to the latch supporting member 636, but without the connection hole and the engaging members thereon.

The latch member 698 is partially contained in the latch supporting member 636. By using conventional pivot connection technology, such as the use of the connection hole 672 and the screws 694 and 696, the latch member 698 may be pivotally connected to the latch supporting member 636.

When assembling the latch member 698, firstly the resilient member 666 is fastened to the fastening holes 636-2 of the latch supporting member 636, and then the extendable handle arm 680 is installed. The operation details of the latch member 698 (as illustrated in FIG. 6) are generally similar to those of the latch member 398 (as illustrated in FIGS. 3, 4(A)-4(C), and 5(A)-5(B)). However, the latch member 398 comprises an extendable handle arm 380, an engagement arm 382, and a linkage member with a first linkage part 386 and a second linkage part 387. During operation, the fixation axis of the latch member 398 is not moved. On the other hand, the latch member 698 comprises an extendable handle arm 680 and a resilient member 666. During operation, the fixation axis of the latch member 698 is moved.

The extendable handle arm member 680 of the latch member 698 may be in a latched position or in an unlatched position. Once the latch member 698 is assembled in the latch supporting member 636, the extendable handle arm 680 is initially in the latched position. When the extendable handle arm 680 is in the latched position, the engaging edge 683 of the first hook 681 of the resilient member 666 is engaged with the pair of first engagement holes formed on the side 676 of the latch supporting member 636, and the second engagement hole 680-1 of the extendable handle arm 680 is engaged with the second hook 636-1 of the latch supporting member 636. Accordingly, the latch member 698 is engaged with the latch supporting member 636.

The aperture 299 of the device chassis 222 illustrated in FIG. 2(B) is designed to be formed at a location corresponding to the first engagement holes on the side 676 illustrated in FIG. 6. Accordingly, when the extendable handle arm 680 is in the latched position, the first hook 681 of the resilient member 666 is engaged with the aperture 299 of the device chassis 222 as well as the first engagement holes formed on the side 676. That is to say, when the assembly of the tray 230 is latched in the device chassis 222, the first hook 681 is engaged with the first engagement holes formed on the side 676, and simultaneously the first hook 681 is engaged with the aperture 299.

When the extendable handle arm 680 is in the unlatched position, the first hook 681 is disengaged from the aperture 299 of the device chassis 222 and the first engagement holes formed on the side 676, and the second engagement hole 680-1 is disengaged from the second hook 636-1. To transition from the latched position to the unlatched position, a user exerts a force on the handle hook 692 of the extendable handle arm 680 and moves the handle hook 692 toward the direction indicated by an arrow 615. Consequently, the second engagement hole 680-1 of the extendable handle arm 680 is disengaged from the second hook 636-1 of the latch supporting member 636. Subsequently, the user moves the handle hook 692 toward a direction indicated by an arrow 616, and the extendable handle arm 680 thus is extended. As the extendable handle arm 680 is extended, a sidewall 698-1 of the latch member 698 pushes the resilient member 666 so that the resilient member 666 moves inwardly into the inner space of the latch supporting member 636. Consequently, the first hook 681 is disengaged from the first engagement holes on the side 676, and simultaneously the first hook 681 is disengaged from the aperture 299 of the device chassis 222.

In light of the above description, in accordance with an exemplary embodiment, a first hot swappable device (the hot swappable hard disk 228) is installed deeply in the inner space of an electronic device (the server 110), and a second hot swappable device (the hot swappable fan 242) is mounted in front of the first hot swappable device (the hot swappable hard disk 228). More specifically, the first hot swappable device (the hot swappable hard disk 228) is firmly latched inside the electronic device (the server 110) by the latch member 698. When the latch member 698 is assembled in the latch supporting member 636 such that the extendable handle arm 680 is in the latched position, the engaging edge 683 of the first hook 681 is engaged with the first engagement holes formed on the side 676, and simultaneously the first hook 681 is engaged with the aperture 299 of the device chassis 222. In addition, the second engagement hole 680-1 is engaged with the second hook 636-1. Accordingly, the latch member 698 is firmly engaged with the device chassis 222. Thereafter, the hot swappable fan 242 can be latched to the electronic device in a conventional way.

Moreover, in accordance with the exemplary embodiment, the second hot swappable device (the hot swappable fan 242) is unlatched and removed, and subsequently the first hot swappable device (the hot swappable hard disk 228) deeply located inside the electronic device (the server 110) is unlatched and extracted. To unlatch the first hot swappable device (the hot swappable hard disk 228), the user need only exert a force on the handle hook 692 of the extendable handle arm 680 and move the handle hook 692 as indicated by the arrows 615 and 616 in FIG. 6. Taking a 1-U server for example, unlatching is simple despite small size. Specifically, the user uses a single finger (e.g., the index finger) to move the handle hook 692 toward a direction indicated by an arrow 615. Consequently, the second engagement hole 680-1 is disengaged from the second hook 636-1. Subsequently, the user moves the handle hook 692 toward a direction indicated by the arrow 616, and the extendable handle arm 680 thus is extended. As the extendable handle arm 680 is extended, the sidewall 698-1 of the latch member 698 pushes the resilient member 666 so that the resilient member 666 moves inwardly into the inner space of the latch supporting member 636. Consequently, the first hook 681 is disengaged from the first engagement holes on the side 676 and the aperture 299 of the device chassis 222. As a result, the extendable handle harm 680 of the latch member 698 is in the unlatched position, and the user can extract the hot swappable hard disk 228. In accordance with the exemplary embodiment, the user can use a single finger to unlatch the second hot swappable device from the server, thus reducing risk of finger injury.

Various advantages are provided by the various embodiments described herein. For example, an unlatch operation can be easily achieved without the use of additional assembly tools. Moreover, in the scenario in which a first hot swappable device is mounted in an inner space of a server and a second hot swappable device is mounted in front of the first hot swappable device, the second hot swappable device firstly can be unlatched and removed, and the first hot swappable device subsequently may be unlatched with reduced risk of finger injury, even if the first hot swappable device is located deep inside the server. In other words, the various embodiments provide substantial advantages in assembling, maintaining, and/or upgrading hot swappable devices used with electronic devices. Further, compared to conventional assembly technology (e.g., fastening by screws), the various embodiments can conserve manpower and can lower costs. Additionally, the various embodiments allow one or more hot swappable devices to be easily mounted in an inner space of a server device. Thus, the allocation of devices used with the server can be more flexible, and the server can accommodate more hot swappable devices.

Although the hot swappable devices described in detail herein in accordance with the various embodiments include a hot swappable hard disk and a hot swappable fan, the hot swappable devices are not limited to these devices. A hot swappable device may comprise but is not limited to a hot swappable power device, a hot swappable hard disk, a hot swappable ODD, a hot swappable battery, and a hot swappable fan. Moreover, as previously described in accordance with exemplary embodiments, the latch supporting member and the supporting member are respectively mounted on two corners of the front end of the tray body. However, other exemplary embodiments are contemplated, including but not limited to an embodiment in which two latch supporting members respectively are mounted on two corners of the front end of the tray body and another embodiment in which only one latch supporting member is mounted on one corner and no latch supporting member is mounted on the other corner. Furthermore, as previously described in accordance with exemplary embodiments, the latch supporting member may be a rectangular tube and the supporting member may be a rectangular tube. However, other exemplary embodiments are contemplated in which the latch supporting member and/or the supporting member may comprise a circular tube, a polygonal tube, or a tube of another shape.

While exemplary embodiments have been described, it will be understood that those skilled in the art, both now and in the future, may make various improvements and enhancements which fall within the scope of the following claims. These claims should be construed to maintain the proper protection for the various embodiments described herein.

What is claimed is:

1. A latch apparatus comprising:
   a latch supporting member;
   a tray member connected to said latch supporting member, wherein a first device is mounted on said tray member, and wherein said first device is selected from a group comprising a hot swappable power device, a hot swappable hard disk, a hot swappable optical disk drive, a hot swappable battery, and a hot swappable fan;
   a cage member connected to said tray member, wherein said first device is located inside said cage member; and
   a latch member connected to said latch supporting member, wherein said latch member comprises an extendable handle arm member, and wherein said latch supporting member comprises a tube member.

2. The latch apparatus according to claim 1, wherein a second device is mounted in front of said first device.

3. The latch apparatus according to claim 2, wherein said second device is selected from a group comprising a hot swappable power device, a hot swappable hard disk, a hot swappable optical disk drive, a hot swappable battery, and a hot swappable fan.

4. The latch apparatus according to claim 1, wherein said tray member comprises a tray body member and a supporting member, and wherein said latch supporting member and said supporting member are respectively mounted on two corners of said tray body member.

5. The latch apparatus according to claim 4, wherein said tray body member, said latch supporting member, and said supporting member define a space for mounting said second device.

6. The latch apparatus according to claim 4, wherein said tray body member, said latch supporting member, and said supporting member are integrally formed.

7. The latch apparatus according to claim 4, wherein said tray body member, said latch supporting member, and said supporting member are respectively connected by a fastening member.

8. The latch apparatus according to claim 1, wherein said latch member further comprises an engagement arm member comprising a first engaging member, wherein said extendable handle arm member comprises a second engaging member, and wherein said latch supporting member comprises a third engaging member and a fourth engaging member.

9. The latch apparatus according to claim 8, wherein said first engaging member is engaged with said cage member and said third engaging member and wherein said second engaging member is engaged with said fourth engaging member when said extendable handle arm member is in a latched position.

10. The latch apparatus according to claim 8, wherein said first engaging member is disengaged from said cage member and said third engaging member and wherein said second engaging member is disengaged from said fourth engaging member when said extendable handle arm member is in an unlatched position.

11. The latch apparatus according to claim 10, wherein said latch member further comprises a linkage member connected to said extendable handle arm member and said engagement arm member, and wherein said linkage member actuates said first engaging member to disengage from said cage member and said third engaging member.

12. The latch apparatus according to claim 8, wherein said first engaging member comprises a first hook, and wherein said second engaging member comprises a second engagement hole.

13. The latch apparatus according to claim 12, wherein said cage member comprises a device housing, and wherein said device housing comprises a first aperture formed on an inner surface thereof for engagement with said first hook.

14. The latch apparatus according to claim 12, wherein said first hook comprises a guiding edge and an engaging edge.

15. The latch apparatus according to claim 12, wherein said third engaging member comprises a pair of first engagement holes for engagement with said first hook, and wherein said fourth engaging member comprises a second hook for engagement with said second engagement hole.

16. The latch apparatus according to claim 1, wherein said latch member further comprises a resilient member comprising a first engaging member, wherein said extendable handle arm member comprises a second engaging member, and wherein said latch supporting member comprises a third engaging member and a fourth engaging member.

17. The latch apparatus according to claim 16, wherein said first engaging member is engaged with said cage member and said third engaging member and wherein said second engaging member is engaged with said fourth engaging member when said extendable handle arm is in a latched position.

18. The latch apparatus according to claim 16, wherein said first engaging member is disengaged from said cage member and said third engaging member and wherein said second engaging member is disengaged from said fourth engaging member when said extendable handle arm is in an unlatched position.

19. The latch apparatus according to claim 16, wherein said first engaging member comprises a first hook, and wherein said second engaging member comprises a second engagement hole.

20. The latch apparatus according to claim 19, wherein said cage member comprises a device housing, and wherein said device housing comprises a first aperture formed on an inner surface thereof for engagement with said first hook.

21. The latch apparatus according to claim 19, wherein said first hook comprises a guiding edge and an engaging edge.

22. The latch apparatus according to claim 19, wherein said third engaging member comprises a pair of first engagement holes for engagement with said first hook, and wherein said fourth engaging member comprises a second hook for engagement with said second engagement hole.

* * * * *